(12) United States Patent
Zamora Gil

(10) Patent No.: US 10,069,287 B2
(45) Date of Patent: Sep. 4, 2018

(54) SYSTEM FOR CONNECTING A FLAT CABLE TO A PRINTED CIRCUIT MOUNTED IN A CONNECTION BOX WITH FLEXIBLE PRESSING LEGS

(71) Applicant: Amadeu F. Zamora Gil, Barcelona (ES)

(72) Inventor: Amadeu F. Zamora Gil, Barcelona (ES)

(*) Notice: Subject to any disclaimer, the term of this patent is extended or adjusted under 35 U.S.C. 154(b) by 0 days.

(21) Appl. No.: 15/748,226

(22) PCT Filed: Jul. 27, 2016

(86) PCT No.: PCT/ES2016/070569
§ 371 (c)(1),
(2) Date: Jan. 29, 2018

(87) PCT Pub. No.: WO2017/017306
PCT Pub. Date: Feb. 2, 2017

(65) Prior Publication Data
US 2018/0219362 A1 Aug. 2, 2018

(30) Foreign Application Priority Data

Jul. 29, 2015 (ES) .................................. 201531125

(51) Int. Cl.
| | |
|---|---|
| *H02G 3/08* | (2006.01) |
| *F16B 2/22* | (2006.01) |
| *H01B 7/08* | (2006.01) |
| *H01R 13/42* | (2006.01) |

(Continued)

(52) U.S. Cl.
CPC ................. *H02G 3/08* (2013.01); *F16B 2/22* (2013.01); *H01B 7/0838* (2013.01); *H01R 4/48* (2013.01);
(Continued)

(58) Field of Classification Search
CPC . H01R 4/48; H01R 4/16; H01R 12/59; H01R 12/61; H01R 12/77; H01R 12/78; H01R 13/42; H01R 13/426; H01R 13/428
(Continued)

(56) References Cited

U.S. PATENT DOCUMENTS

| | | |
|---|---|---|
| 3,547,718 A | 12/1970 | Gordon |
| 4,714,435 A | 12/1987 | Stipanuk et al. |

(Continued)

FOREIGN PATENT DOCUMENTS

| | | |
|---|---|---|
| CN | 201319426 Y | 9/2009 |
| CN | 204178750 U | 2/2015 |

(Continued)

OTHER PUBLICATIONS

International Search Report and Written Opinion dated Nov. 2, 2016 from corresponding International Application No. PCT/ES2016/070569; 9 pgs.

*Primary Examiner* — Chandrika Prasad
(74) *Attorney, Agent, or Firm* — Maier & Maier, PLLC

(57) ABSTRACT

A connection system for electrical, signal and/or data installations, which includes: multilayer flat cables with parallel conductive tracks disposed between a first layer made of a semi-rigid, flat insulating material and having a series of transverse recesses to remove a portion of the first layer and define an end connecting portion at the ends of the flat cable; and a second layer of insulating material formed by a polymer. The disclosure further includes mechanisms that includes a printed circuit provided with conductive tracks and housed in a connection box made of insulating material, the box having lateral windows for inserting the flat cables and containing flexible feet that act, by an oblique jagged surface, on the insulating layer of the flat cable.

5 Claims, 4 Drawing Sheets

(51) Int. Cl.
*H01R 4/48* (2006.01)
*H05K 1/11* (2006.01)
*H01R 12/79* (2011.01)
*H01R 12/59* (2011.01)
*H01R 13/66* (2006.01)

(52) U.S. Cl.
CPC ............. *H01R 12/59* (2013.01); *H01R 12/79* (2013.01); *H01R 13/42* (2013.01); *H05K 1/118* (2013.01); *H01R 13/6658* (2013.01)

(58) Field of Classification Search
USPC .................................. 439/493, 496, 499, 775
See application file for complete search history.

(56) References Cited

U.S. PATENT DOCUMENTS

| | | | | |
|---|---|---|---|---|
| 5,306,162 A * | 4/1994 | Armendariz | ....... | H01R 12/7082 439/493 |
| 5,383,788 A * | 1/1995 | Spencer | ................. | H01R 12/62 439/493 |
| 2009/0137147 A1 * | 5/2009 | Yang | ...................... | H01R 12/79 439/499 |
| 2010/0075541 A1 * | 3/2010 | Niitsu | .................. | H01R 12/774 439/658 |
| 2010/0087087 A1 * | 4/2010 | Yeh | ........................ | H01R 4/023 439/493 |
| 2010/0297872 A1 * | 11/2010 | Hasegawa | ............ | H01R 12/613 439/499 |
| 2012/0102727 A1 * | 5/2012 | Tien | ..................... | H01R 43/055 29/761 |
| 2012/0252260 A1 | 10/2012 | Tseng et al. | | |
| 2013/0314849 A1 | 11/2013 | Mazzullo et al. | | |

FOREIGN PATENT DOCUMENTS

| | | |
|---|---|---|
| EP | 0030639 A1 | 6/1981 |
| ES | 2046149 A6 | 1/1994 |

* cited by examiner

SYSTEM FOR CONNECTING A FLAT CABLE TO A PRINTED CIRCUIT MOUNTED IN A CONNECTION BOX WITH FLEXIBLE PRESSING LEGS

FIELD

The present invention relates to a connection system for electrical, signal and/or data installations, which can be used in both household and industrial applications; said system comprising flat cables and mechanisms (plugs, switches, splices, etc.) for the realization of diverse installations.

This system has several constructive features designed to allow a very simple construction and allowing the realization of installations by the end user or by professionals who need the job to be quick, cheap, safe and without major undertakings.

BACKGROUND

There are currently on the market different elements that allow building electrical circuits, the best known being mechanisms provided with a printed circuit and different types of cables, such as parallel cables or flexible flat cables.

The flexible flat cable or FFC cable is widely known in the world of electronics and consists of a type of flexible printed circuit. The cable is usually made of a flat and flexible plastic film, of fixed length, with multiple metal conductors attached to a surface; the flat cable comprises at its ends plastic reinforcements provided with contacts which form rigid plugs designed to connect the FFC cable into electronic or computer equipment.

Some prior art information on this type of flexible flat cables is described in CN 201319426 Y (TIANRUI ELECTRONICS SHENZHEN C) and in U.S. Pat. No. 4,714,435 A (STIPANUK JOHN M et al.).

These flat cables present characteristics that make them especially suitable for the internal connection of electronic or computer equipment or, as specified in Patent CN201319426, for the connection of a high-definition multimedia interface; however, they do not have adequate characteristics to perform external or surface installations, household or industrial, involving electricity, signals and/or data, due to its high flexibility and the need to incorporate a rigid pin in its ends that will provide the stiffness necessary for its connection to any device.

The printed circuit or PCB (Printed Circuit Board) consists of a surface comprising tracks of conductive material, laminated on a non-conductive base. The printed circuit is usually used to electrically connect a set of electronic components through the conductive tracks and mechanically sustain said electronic components by means of the base.

These tracks are generally made of copper while the base is made of reinforced fiberglass, ceramic, plastic, Teflon or polymers such as Bakelite.

Both the flexible flat cable and the printed circuit have a specific application in the world of electronics.

In household as well as in industrial installations, other types of conductors are used which consist of cables, generally made of copper and with a larger section, sheathed separately in an insulating material and joined throughout their entire length by an external tubular cover.

The installation of this type of cables is usually embedded for aesthetic reasons, and requires the intervention of various professionals.

The realization of installations with these cables requires connecting them with various mechanisms (plugs, switches, splices, etc.). It is necessary to strip the ends of the cables to be connected, open said mechanisms, insert the stripped wires in the connection terminals of the mechanism and fix them in said position by tightening screws or other similar elements, and finally closing the mechanism already connected.

This operation is particularly slow and complex, in particular for end users who do not have specific knowledge in carrying out electrical, signal, data or any other type of installations.

Patent ES 2 046 149 describes a system for the integral electrification of residential buildings based on: two types of belts for the supply of electrical energy, each of which contains certain circuits with flexible conductors made of copper and comprising a dielectric and protective cover for a minimum of 500 volts; a transmission-reception belt model of high and low frequency signals for electronic equipment with parallel and coaxial copper conductors isolated from interferences; and some pressure connection strips for each type of belt. These belts have a variable cross section, depending on the thickness of the conductors integrated therein.

U.S. Pat. No. 3,547,718 discloses a method for manufacturing flat flexible electric cables, one of which is a cable with a plurality of parallel conductors coated on one side with a self-supporting and continuous insulating film; and coated on the other side, discontinuously, with an insulating material, said second side comprising transverse areas spaced longitudinally, in which the conductors are exposed.

Said transversal areas are arranged in correspondence with the cutting areas of the cable, and spaced according to the length of the cable to be manufactured.

Also known are the mechanisms that have metallic contacts acting simultaneously as retention springs of the conductors inserted inside them.

The drawback of these contacts is that they are made of a metal with suitable characteristics for acting as an electrical conductor, but unsuitable for acting as a retention spring, since the memory effect of the retention spring is reduced when a small number of connections and disconnections of a conductor cable are made, the mechanism thus providing a defective contact with the connecting cable.

An example of this type of contact-retention spring is described in US Patent 2012252260 A1 (TSENG TING CHANG et al.)

Therefore, the technical problem that arises is the development of a connection system for electrical installations, signal and/or data, usable both for household and industrial applications, which can be used in the realization of installations by end users as well as professionals who need a quick and cheap installation without major undertakings.

DESCRIPTION OF THE INVENTION

The connection system for electrical, signal and/or data object of the invention, is constituted by multilayer flat cables with several parallel conductive tracks disposed between a first layer and a second layer of insulating material forming two external surfaces of said flat cables; and by mechanisms for performing electrical, signal and/or data installations, comprising: mechanisms or internal electronic components that are not accessible to the end user and that are mounted on a printed circuit provided with conductive tracks and housed in a connection box made of insulating material which comprises lateral windows for inserting one of the ends of the flat cables and for connecting its conductive tracks with the conductive tracks of the printed circuit of the corresponding mechanism. Said connection system presents constructive features designed to solve the technical problems mentioned above and to provide a series of additional advantages in the realization of installations.

As an example, this system offers the added advantage of reducing the volume of conductive material necessary for its manufacture, in comparison with conventional conductive cables, for the same working conditions, in addition to the high modularity involved in the construction of the system of the invention.

By the same token, and given its characteristics, it also reduces the amount of insulating material needed in the installations as it does not require channels or tubes to maintain the different lines joined to each other.

An object of the invention is the development of a semi-rigid flat cable having a greater rigidity than the aforementioned flexible FFC flat cables and a lower rigidity than printed or PCB circuits, so that it is suitable for installations without the cable forming folds or wrinkles and with the cable staying flat; also allowing the connection of the ends of the cable with installation mechanisms, inserting them directly into said mechanisms, without the need to mount rigid pins or terminals on the ends of the flat cable for connection, as is the case with flexible flat FCC cables.

For this purpose, the first layer of insulating material of the flat cable is made of a plastic material resistant to bending and of low resilience, which allows it to be wound up in reels and subsequently recover its original flat shape.

Being a multi-layer system, this also allows adding intermediate layers between the two insulating materials that make up the outer layers, offering additional features to the system. As an example, it is possible to add an intermediate insulating layer to place the connections at two levels, use double-sided adhesive tape to allow fixing it to any kind of support, add a Faraday cage to avoid any kind of interference, add a shield in the upper layer (exposed) to give greater resistance to cuts or breaks, or any other structure or feature that is deemed appropriate in the future.

Another objective of the invention is to provide said semi-rigid flat cable with technical characteristics that allow to eliminate quickly and easily an end portion of the first insulating layer of plastic material resistant to bending, and define a connection end portion at the ends of the cable, in which the conductive tracks thereof are exposed to the face corresponding to the first external surface of the flat cable so as to contact the tracks of the printed circuit housed in a connection box, and to maintain the conductive tracks of the flat cable covered by the insulating layer of flexible material forming the second surface of said flat cable.

In this way, the possibilities of errors during the installation are completely eliminated, especially taking into account that the conductive tracks for different applications (current, signals, data, etc.) are conveniently arranged so that they coincide with the connections of the internal devices housed in the boxes specifically intended for each of said applications.

Another objective of the invention is that the connection boxes have flexible legs formed in the insulating material itself of the connection box and act on the second insulating layer of the connection end portion of the flat cable, pressing the conductive tracks of the flat cable against the conductive tracks of the printed circuit of the mechanism in question, so that the function of retention of the flat cable in the coupling position is carried out by the flexible legs of the box and not by the conductive tracks responsible for establishing the electrical contact.

This allows that the tightening of the connections is made simultaneously in each and every one of the connections to be made, avoiding the possibility for some terminal of the connection to have a bad contact.

In order to achieve the proposed objectives, this connection system presents several technical features included in the appended claims. It is highly recommended for both novice users and professionals, and allows to be presented as a kit of flat cables and various mechanisms (plug, crossing, switch, etc. for electrical, signal or data installations) so that the client can select the necessary components depending on the installation to be achieved, and expand it or modify it later during the useful life of the various components.

DESCRIPTION OF THE FIGURES

To complement the description that is being made, and in order to facilitate the understanding of the characteristics of the invention, a set of drawings detailed below is annexed to illustrate the present description with a non-limiting character.

PREFERRED EMBODIMENT OF THE INVENTION

Figure 1:
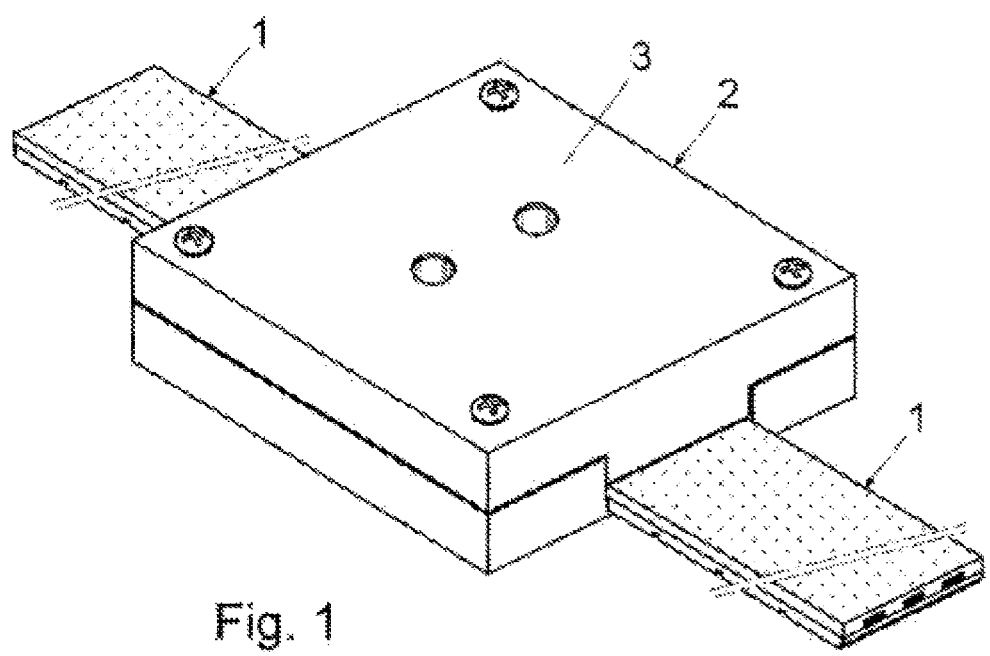
FIG. 1 shows a perspective view of an embodiment of the connection system for electrical, signal or data installations according to the invention, in which two semirigid flat cables coupled to a plug mechanism can be observed.

As can be seen in the attached figures, this connection system comprises flat cables (1) that establish connections between different mechanisms (2) of the installation to be made, which mechanisms (2) may be, by way of example: plugs, switches, crossing mechanisms, data plugs, or any other mechanisms commonly used in this type of installation.

The multi-layer flat cables (1) comprise a first layer (11) and a second layer (12) of insulating material between which several conductive tracks (13) are arranged in parallel; with the particularity that the first layer (11) of insulating material is constituted by a plastic material resistant to bending and of low resilience, which presents on its external surface a series of transverse recesses (14) distributed along the flat cable (1) and which facilitate its winding and adaptation to the support or surface of the installation and which define breaking zones in said first layer (11).

The first layer (11) and the second layer (12) of insulating material are continuous and cover the conductive tracks (13) over the entire length of the flat cable, which allows the cable to be cut to the desired length, maintaining the insulation of the conductors through their entire length, regardless of the number of transverse recesses that are located between the two ends of the flat cable (1) once cut.

Figure 3:
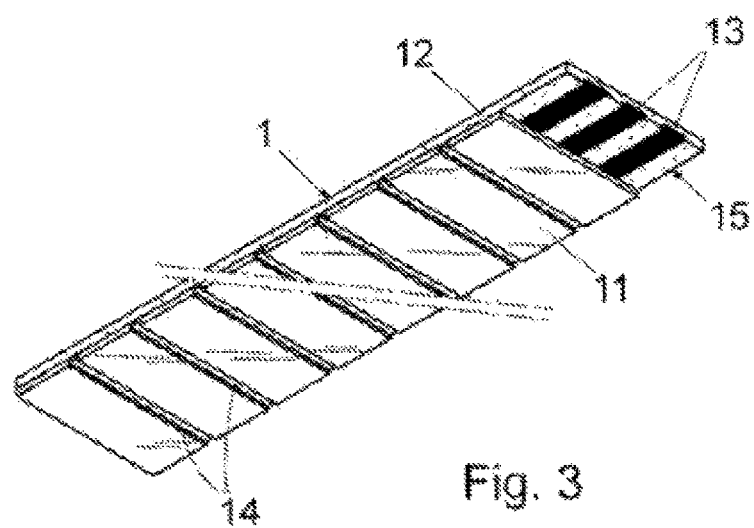
FIG. 3 shows a view, analog to the previous one, of a portion of semirigid flat cable in which a portion of the first layer of bending-resistant plastic material has been removed, defining in the cable a connection end portion.
Figure 4:
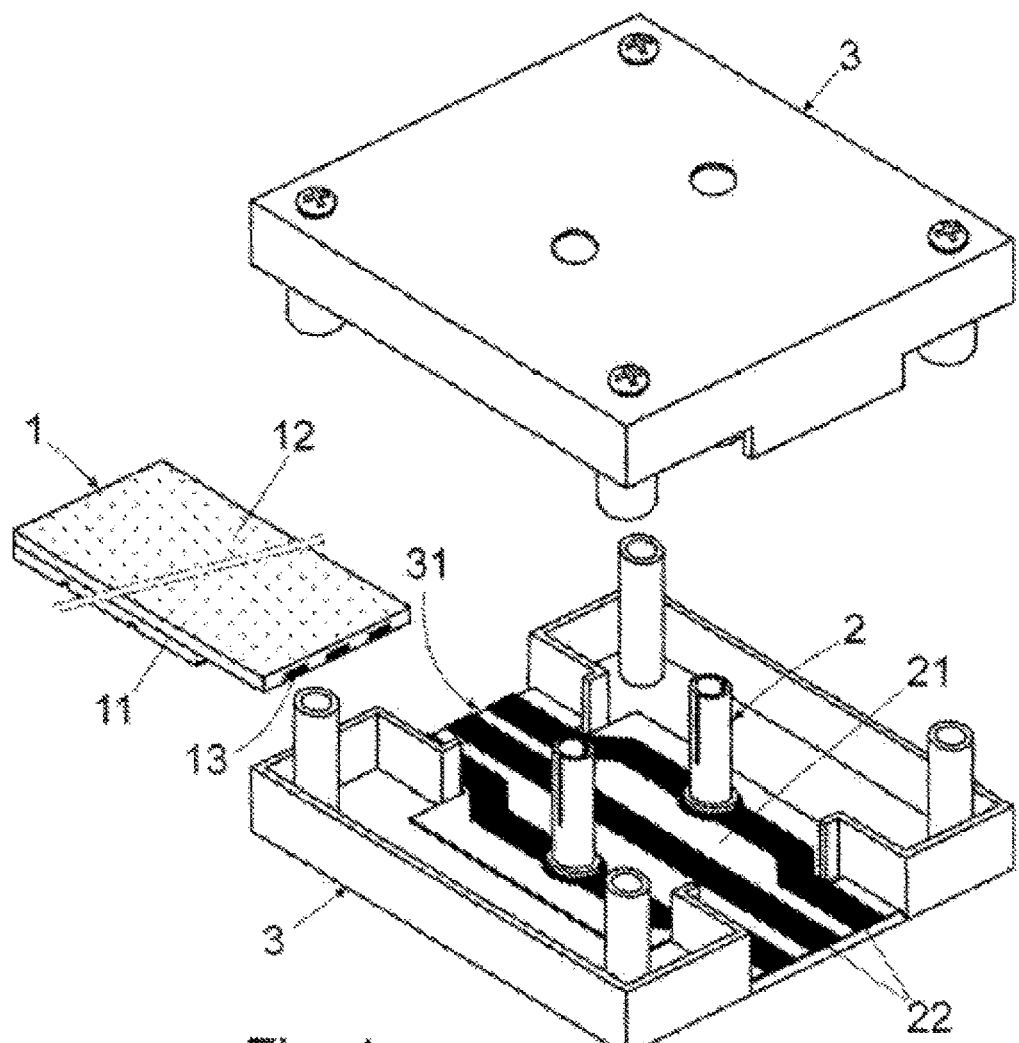
FIG. 4 shows an exploded view in perspective of the box of a plug mechanism and one of the cables intended to be connected to it.

As can be seen in FIG. 3, these transverse recesses (14) define break zones that make it possible to manually and simply remove a portion of said first insulating layer (11) and define a connection end portion (15) at the ends of the flat cable (1) in which the conductive tracks (13) are exposed to the first outer surface of the semirigid flat cable; that is to say, the surface previously occupied by the first layer (11) of plastic material resistant to bending.

In this connection end portion (15) the conductive tracks (13) are kept covered by the opposite side by means of the second layer (12) of insulating material that is made of a flexible polymer.

Depending on the application for which said flat cables (1) are intended, there can be a variable number of conductive tracks (13) having a flattened configuration and sections suitable to the type of current, signals or data to be connected.

Additionally, the first layer (11) and the second layer (12) can incorporate a double-sided adhesive tape to allow fixing it to any support surface, as well as other intermediate layers, both insulating and conductive (see FIGS. 6 and 7), that would give it the necessary characteristics to be able to perform different functions, such as electromagnetic shielding, large-area ground connections or others.

In particular, the second layer (12) of the cable can incorporate a plastic or fiber shield on its external surface to give it greater resistance to cuts, breaks or environmental aggressions.

This flat configuration of the conductive tracks allows them to have large contact surfaces to prevent serial losses, or unnecessary heating of the connections, which is an improvement over the current systems where the contact surface is much smaller.

The flat cable has a constant thickness, except in the areas corresponding to the transverse recesses (14).

The flat cables have a thickness greater than 2 millimeters, preferably between 2 and 4 millimeters, and a variable width depending on the number and width of the conductive tracks included in each of said flat cables.

The mechanisms (2) comprise a printed circuit (21) or PCB with electronic components or mechanisms suitable for performing in each case the specific functions of the mechanism in question, for example: interconnection, checking or modification of data, signals or electric current; said printed circuit (21) being provided with conductive tracks (22) for connection to the flat cables (1).

Said printed circuit (21) is housed in a closed connection box (3) which prevents access and manipulation of the mechanism (2) and which disposes of lateral windows (31) for inserting one of the ends of the flat cables (1) and for connecting their conductive tracks (13) to the conductive tracks (22) of the printed circuit (21) of the corresponding mechanism (2).

Figure 5:
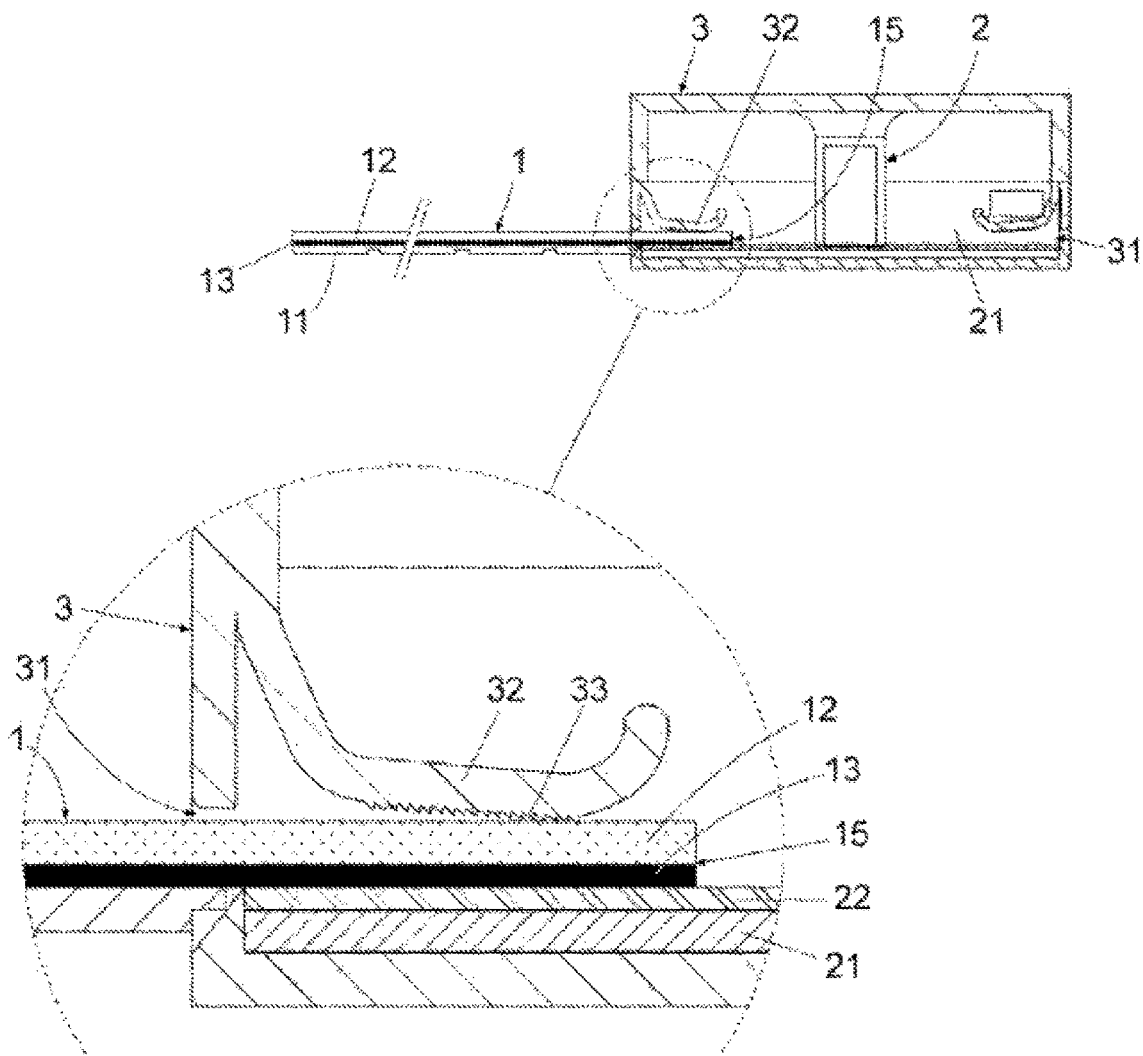
FIG. 5 shows an elevation view sectioned by a vertical plane of the elements of FIG. 4 once assembled, as well as an enlarged detail of the area of operation of one of the flexible legs of the box against the flat cable connected to the inside mechanism of the box.

As can be seen in FIG. 5, the connection boxes (3) internally comprise flexible legs (32), formed in the insulating material itself of the connection box (3) and acting on the second insulating layer (1) of the connection end portion (15) of the flat cable inserted in the connection box (3) by pressing the conductive tracks (13) of the flat cable (1) against the conductive tracks (22) of the printed circuit (21) of the correspondent mechanism (2).

Said flexible legs (32) of the connection box (3) have an oblique jagged surface (33), inclined towards the inside of the box and acting against the second insulating layer (12) of the corresponding flat cable (1), maintaining it in a coupling and connecting position with the mechanism (2).

In one embodiment of the invention, the connection boxes (3) containing the various mechanisms (2) are closed boxes, without access for the end user with the mechanism incorporated therein, and a printed circuit for the transport and connection of the various types of serial, as well as the modification of the serial itself in the cases when it is required (for example: ADSL filtering, amplification, sensors, thermostats, etc.).

Figure 2:
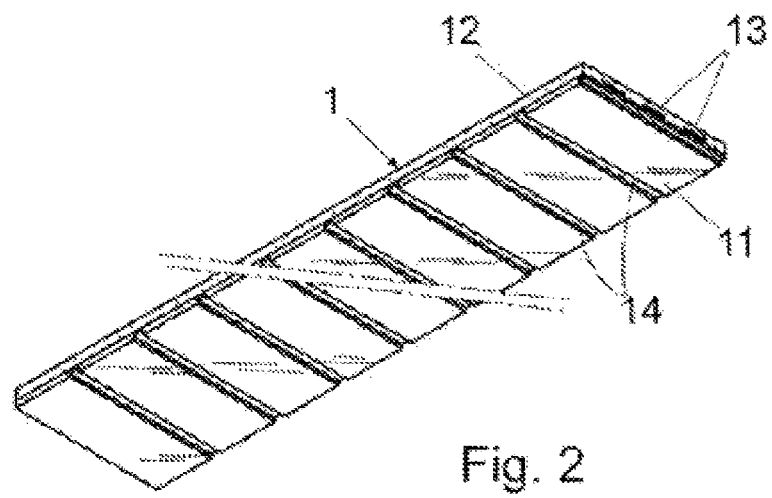
FIG. 2 shows a bottom perspective view of the semirigid flat cable, according to the invention.

As already mentioned, the mechanism (2) may have a variable configuration depending on the function to be performed by it, a plug mechanism being shown in FIGS. 1, 2 and 5.

Figure 6:
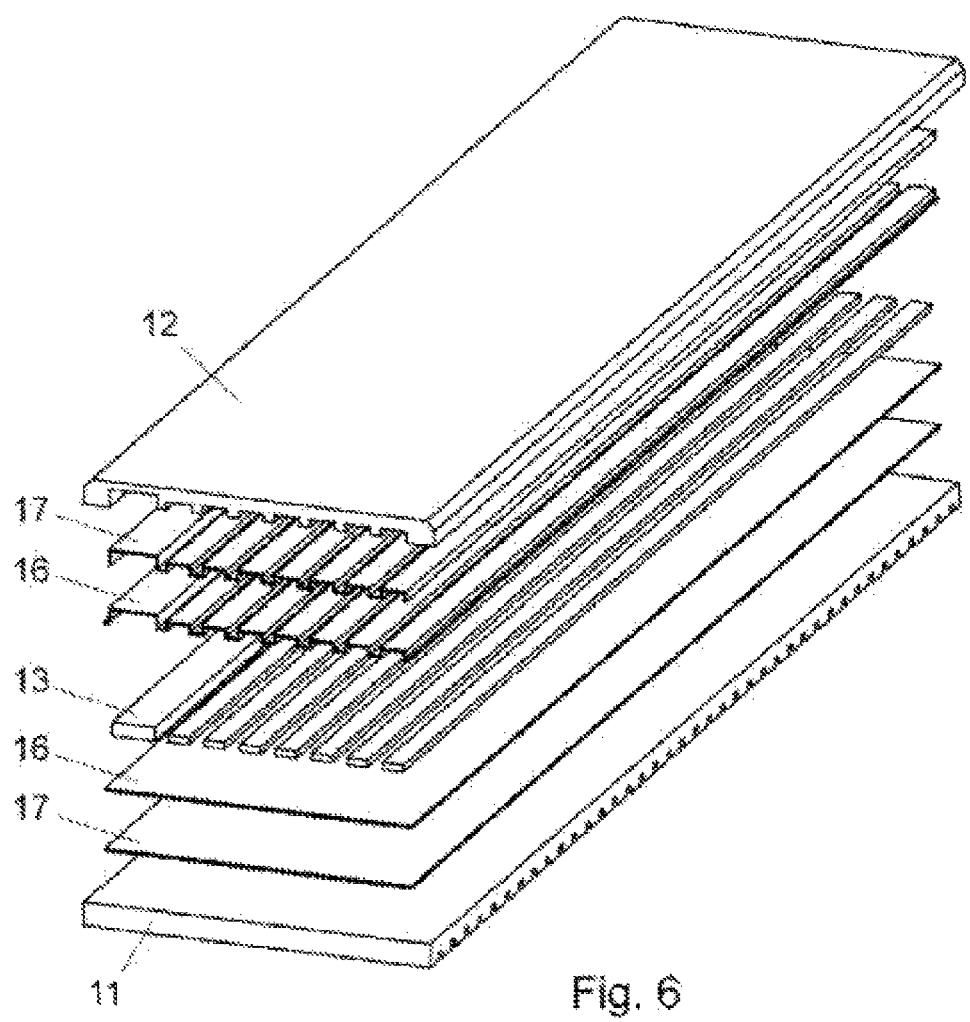
FIG. 6 shows an exploded view in perspective of a variant embodiment of the flat cable, incorporating between the conductive tracks and each of the insulating layers, an electrically insulating sheet and an electrically conductive sheet or mesh, forming a Faraday cage.
Figure 7:
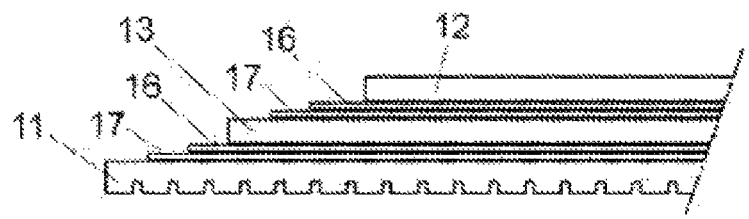
FIG. 7 is a profile view of the flat cable of the previous figure, sectioned longitudinally by a vertical plane coinciding with one of the conductive tracks and in which the layers of the cable have been transversely sectioned in a staggered manner to more easily see each one of the layers that it comprises.

In the variant embodiment shown in FIGS. 6 and 7, the flat cable (1) illustrated comprises between the conductive tracks (13) and each of the first and second insulating layers (11, 12), additional layers (16, 17) designed to improve the quality and speed of the signals and/or the transmitted data, to avoid interferences or simply to adapt to the customer specifications. In this embodiment, the additional layers (16, 17) are respectively formed by an electrically insulating sheet, in contact with said conductive tracks (13), and by an electrically conductive sheet or mesh, forming a Faraday cage.

The purpose of said electrically conductive additional layer (17) is to protect the conductive tracks (13) from possible external electromagnetic fields and to avoid interferences or noise in the transmission of signals and/or data.

Now that the nature of the invention has been sufficiently described, along with an example of a preferred embodiment, it is stated for the appropriate purposes that the materials, shape, size and arrangement of the described elements could be modified, provided that this does not entail an alteration of the essential features of the invention that are claimed below.

The invention claimed is:

1. A connection system for electrical, signal and data installations, comprising:

multilayer flat cables with several parallel conductive tracks arranged between a first layer and a second layer of insulating material forming two external surfaces of said flat cables, and mechanisms for the realization of installations comprising: mechanisms or electronic components mounted on a printed circuit provided with conductive tracks and housed in a connection box, made of insulating material, said connection box having lateral windows for inserting one of the ends of the flat cables and for connecting its conductive tracks to the conductive tracks of the printed circuit of the corresponding mechanism; wherein the first layer of insulating material of the flat cable is made of a plastic material resistant to bending and of low resilience, which presents on its external surface a series of transverse recesses, distributed along the flat cable which facilitate its winding and define break zones for removing a portion of said first insulating layer and for defining at the ends of the flat cable a connection end portion, directly able to be coupled to the connection box, and in whose connection end portion the conductive tracks are exposed to the first outer surface of the semi-rigid flat cable, the second layer of insulating material of the flat cable is made of a flexible polymer;

the connection boxes internally comprise flexible legs formed in the insulating material itself of the connection box and acting on the second insulating layer of the connection end portion of the flat cable by pressing the conductive tracks of the flat cable against the conductive tracks of the printed circuit of the mechanism.

2. The system according to claim 1, wherein the flexible legs of the connection boxes have an oblique jagged surface inclined towards the inside of the box with which they act against the second insulating layer of the corresponding flat cables, maintaining it in a coupling and connecting position with the mechanism.

3. The system, according to claim 1, wherein the first layer and the second layer of insulating material are continuous and cover the conductive tracks over the entire length of the flat cable.

4. The system, according to claim 1, wherein the flat cable has a constant thickness, except in the areas corresponding to the transverse recesses.

5. The system, according to claim 1, wherein, in cases where a standard electrical connection is not required, the flat cables comprise, between the conductive tracks and each of the insulating layers, additional layers designed to improve the quality and speed of the signals and the transmitted data, to avoid interferences or to adapt to the customer specifications.

* * * * *